(12) United States Patent
Bezabeh et al.

(10) Patent No.: US 6,821,784 B1
(45) Date of Patent: *Nov. 23, 2004

(54) METHOD OF DIAGNOSING COLORECTAL ADENOMAS AND CANCER USING PROTON MAGNETIC RESONANCE SPECTROSCOPY

(75) Inventors: Tedros Bezabeh, Winnipeg (CA); Ian C. P. Smith, Winnipeg (CA); Charles Noah Bernstein, Winnipeg (CA); Bernard Levin, Houston, TX (US); Constance Johnson, Bellaire, TX (US)

(73) Assignees: The University of Manitoba, Winnipeg (CA); National Research Council of Canada, Ottawa (CA); Board of Regents, University of Texas System, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/979,049

(22) PCT Filed: May 16, 2000

(86) PCT No.: PCT/US00/13329

§ 371 (c)(1),
(2), (4) Date: Nov. 16, 2001

(87) PCT Pub. No.: WO00/71997

PCT Pub. Date: Nov. 30, 2000

Related U.S. Application Data

(60) Provisional application No. 60/135,039, filed on May 20, 1999.

(51) Int. Cl.[7] .............................................. G01N 33/48
(52) U.S. Cl. ........................... 436/64; 435/4; 435/7.23; 324/300; 436/63; 436/91; 436/93; 436/94; 436/173; 436/179
(58) Field of Search ........................ 436/63–64, 93–94, 436/173, 179, 183, 91; 324/300; 435/4, 7.23

(56) References Cited

U.S. PATENT DOCUMENTS

| | | | | | |
|---|---|---|---|---|---|
| 5,695,945 | A | * | 12/1997 | Tsuji | 435/7.23 |
| 5,741,650 | A | * | 4/1998 | Lapidus et al. | 435/6 |
| 6,335,193 | B1 | * | 1/2002 | Nair | 435/325 |
| 2003/0148260 | A1 | * | 8/2003 | Levin et al. | 435/4 |

OTHER PUBLICATIONS

Mountford C E et al, The Lancet 1986, 651–653.*
Halliday, K. R. et al, Magnetic Resonance in Medicine 1988, 7, 384–411.*
Masella, R. et al, FEBS Letters 1989, 246, 25–29.*
Kasimos, J. N. et al, Cancer Research 1990, 50, 527–532.*
Smith, I. C. P. et al, Analytical Chemistry 1990, 62, 853A–859A.*
Lean, C. L. et al, Biochemistry 1992, 31, 11095–11105.*
Singer, S. et al, Surgical Oncology 1993, 2, 7–18.*
Lean, C. L. et al, Magnetic Resonance in Medicine 1993, 30, 525–533.*
Singer, S. et al, Cancer Research 1993, 53, 5808–5814.*
Eugene, M. et al, Clinical Biochemistry 1994, 27, 191–194.*
Mackinnon, W. B. et al, International Journal of Cancer 1994, 59, 248–261.*
Schneider, M. U. et al, Digestive Diseases and Sciences 1987, 32, 494–499.*
Chen, W. et al, Archives of Surgery, 1987, 122, 1284–1288.*

* cited by examiner

*Primary Examiner*—Arlen Soderquist
(74) *Attorney, Agent, or Firm*—George A. Seaby

(57) ABSTRACT

Two dimensional COSY magnetic resonance spectroscopy of human stool can be used in a non-invasive method of detecting the presence of colorectal cancer. The spectrum of a patient's stool is compared with that of stool from non-cancerous subjects, observed differences in spectra being indicative of cancer.

16 Claims, 3 Drawing Sheets

METHOD OF DIAGNOSING COLORECTAL ADENOMAS AND CANCER USING PROTON MAGNETIC RESONANCE SPECTROSCOPY

This application is a US national phase of International Patent Application PCT/US00/13329, filed May 16, 2000, which claims benefit of U.S. Provisional Application 60/135,039 filed May 20, 1999.

This invention relates to a method of detecting colorectal adenomas and cancer, and in particular to a method of detecting such adenomas and cancer using proton magnetic resonance spectroscopy.

Colorectal cancer is one of the most common cancers in the U.S.A. and Canada accounting for approximately 146,000 new cases in 1999. The lifetime risk that an individual in North America will develop colorectal cancer is about 5–6%. Symptoms associated with colorectal cancer, including blood in the stool, anemia, abdominal pain and alteration of bowel habits often become apparent only when the disease has advanced significantly. It is well known that prognosis for a patient depends largely on the stage of the disease at the time of diagnosis. In fact, whereas the five-year survival for a patient whose colorectal cancer is detected at an early stage is 92%, survival decreases to about 60% in patients with regional spread, and to about 6% in those with distant metastasises. Accordingly, it is important to detect the precursor adenomas and cancer as early as possible to increase the chances of successful therapeutic intervention.

Screening for a disease requires that the disease be prevalent in a large segment of the population and that early detection of the disease decreases mortality and improves quality of life. Colorectal cancer meets these requirements and, thus, is an ideal candidate for such a program. The natural history of colorectal cancer, namely the progression from adenoma to adenocarcinoma occurring over a number of years (5–15), also makes it a suitable target. The cost benefit analysis for the early detection of colorectal cancer has also been shown to be favourable (Bolin, T D. Cost benefit of early diagnosis of colorectal cancer. Scand J Gastroenterol 1996; 31 Suppl 220:142–146).

The screening technique itself also has to meet a series of criteria, such as, high sensitivity and specificity, low cost, safety and simplicity. Currently, digital rectal examination (DRE), fecal occult blood test (FOBT), barium enema and direct colon visualization (sigmoidoscopy and colonoscopy) are used for this purpose.

DRE involves examining the rectum using a finger. This method detects cancers that can be palpated and are within reach of the finger. A negative DRE provides little reassurance that a patient is free of cancer, because fewer than 10% of colorectal cancers can be palpated by the examining finger.

FOBT detects hidden blood in the stool by chemical means on the assumption that all colorectal cancers bleed. Although the least expensive and the simplest, the FOBT method has low sensitivity, moderate specificity and is usually not good for early detection. According to available data, a major drawback of this technique is that more than half of the cancers discovered by this method followed by x-ray or endoscopy are usually beyond the limit of early staging. A false positive rate of 10–12% is expected when the patients tested are on an unrestricted diet. Estimates of the positive predictive value range from 2.2 to 50%. The guaiac tests have a very low sensitivity, generally around 50% (Ransohoff D F, Lang C A, Screening for colorectal cancer with the fecal occult blood test; a background paper. Ann Intern Med 1997; 126:811–822). The use of FOBT is based on the assumption that colorectal cancers are associated with bleeding. However, some colorectal cancers bleed intermittently and others not at all.

A barium enema involves an x-ray of the bowel using a contrast agent. The enema can be a single or double contrast. The main radiologic signs of malignancy include muscosal distraction, abrupt cut-off and shouldering and localized lesions with sharp demarcations from uninvolved areas. The estimated sensitivity of double contrast barium enema for cancer and large polyps is only about 65–75% and even lower for small adenomas. Despite its better diagnostic yield, double contrast barium enema has a false-negative rate of 2–18%. Moreover, the method involves exposure to radiation, the repeated use of which may not be safe. Perforation from barium enema is extremely uncommon, but when it happens it is frequently fatal or leads to serious long term problems as a result of barium spillage into the abdominal cavity.

A variety of instruments (collectively called endoscopes) are used for examining the bowel. Endoscopes can be rigid or flexible with varying lengths. Rigid sigmoidoscopes are usually 25 cm long while flexible sigmoidoscopes are 35 or 60 cm long. A colonoscope is a 130–160 cm flexible viewing instrument for examining the entire colon. Biopsies are taken from suspicious looking areas while viewing the colon through the endoscope. The flexible sigmoidoscopy examination is limited to the left side of the colon and rectum. Approximately ⅓ of neoplastic tumors occur in areas proximal to the splenic flexure that are inaccessible by sigmoidoscopy. Colonoscopy has a high sensitivity, and remains the gold standard for visualization of the colon and the detection of neoplastic abnormalities. However, it is invasive, quite expensive, and exposes the subject to risks of bowel perforation.

Magnetic resonance spectroscopy (MRS) is a technique that has the potential to detect small and early biochemical changes associated with disease processes, and has been proven to be useful in the study of tissue biopsies from cancer patients (Smith I C P, Bezabeh T. Tissue NMR ex vivo.In: Young I R, editor, Encyclopedia of NMR: Medical Spin-off Volume, In Press (2000)). It is particularly useful to detect small, mobile chemical species in a given biological sample that are of diagnostic interest. Obtaining tissue biopsies for such an examination, however, usually involves an invasive procedure.

There are a number of currently available methods for detecting cancer in its early stages. Biophysical methods such as conventional X-rays, nuclear medicine, rectilinear scanners, ultrasound, CAT and MRI all play an important role in early detection and treatment of cancer. Clinical laboratory testing for tumor markers can also be used as an aid in early cancer detection. Tumor marker tests measure either tumor-associated antigens or other substances present in cancer patients which aid in diagnosis, staging, disease progression, monitoring response to therapy and detection of recurrent disease. Unfortunately, most tumor marker tests do not possess sufficient specificity to be used as screening tools in a cost-effective manner. Even highly specific tests suffer from poor predictive value, because the prevalence of a particular cancer is relatively low in the general population. The majority of available tumor marker tests are not useful in diagnosing cancer in symptomatic patients because elevated levels of markers are also seen in a variety of benign diseases. The main clinical value of tumor markers is in tumor staging, monitoring therapeutic responses, predicting patient outcomes and detecting recurrence of cancer.

U.S. Pat. Nos. 4,912,050 and 4,918,021, issued to E. T. Fossel on Mar. 27, 1990 and Apr. 17, 1990, respectively disclose a technique for detecting cancer by proton nuclear magnetic resonance (NMR) of blood, blood serum or blood plasma. U.S. Pat. No. 5,261,405, issued to the same inventor on Nov. 16, 1993 describes an apparatus and method for automating the process.

U.S. Pat. No. 5,318,031, issued to Mountford et al on Jun. 7, 1997 describes a method for determining chemical states of living animal or human tissue using NMR and 2D-COSY (two-dimensional correlation) NMR spectroscopy, and comparing measured values to reference measurements of normal, abnormal and transitions state tissue.

C. L. Lean et al (Magn. Reson Med 20:306–311, 1991; Biochemistry 3:11095–11105, 1992 and Magn Reson Med 30:525–533, 1992) describe the use of magnetic resonance spectroscopy to examine colon cells and tissue specimens.

However, a need still exists for an inexpensive, non-invasive method of detecting colorectal cancer and colorectal adenomas. The object of the present invention is to provide a relatively simple, non-invasive method of detecting colarectal adenomas and cancer which meets the above defined criteria of high sensitivity and specificity, low cost and safety.

Accordingly, the invention relates to a method of detecting the presence of colorectal adenomas and colorectal cancer in a patient comprising the steps of subjecting a liquid suspension of a stool sample from the patient to magnetic resonance spectroscopy; and comparing the resulting spectrum with the magnetic resonance spectra of stool from non-cancerous subjects, with observed differences in spectra being indicative of cancer.

The performing of spectral analysis on human stool offers a significant advantage over other methods, because the collection of the specimen is non-invasive and presents no risk to the patient. Moreover, no special processing of the sample is required prior to analysis.

The use of 2D-COSY spectroscopy is preferred, because while one-dimensional 1D MRS can give information on the nature and relative intensities of biochemical species present in a given sample, it does not always allow an exclusive and unambiguous identification of some of the species. Two dimensional MRS can be defined as a series of 1D MR spectra acquired with varying pulse delays, and subsequently Fourier-transformed along two axes (the acquisition time and the delay time). Such an approach allows the separation of composite 1D spectral resonances by generating cross-peaks in a second dimension, which identifies protons coupled together. The method makes it possible to detect species present in low concentrations, and normally masked in 1D spectra by other species present in larger concentrations.

The invention is described below in greater detail with reference to the accompanying drawings, wherein.

METHOD

Figure 1:
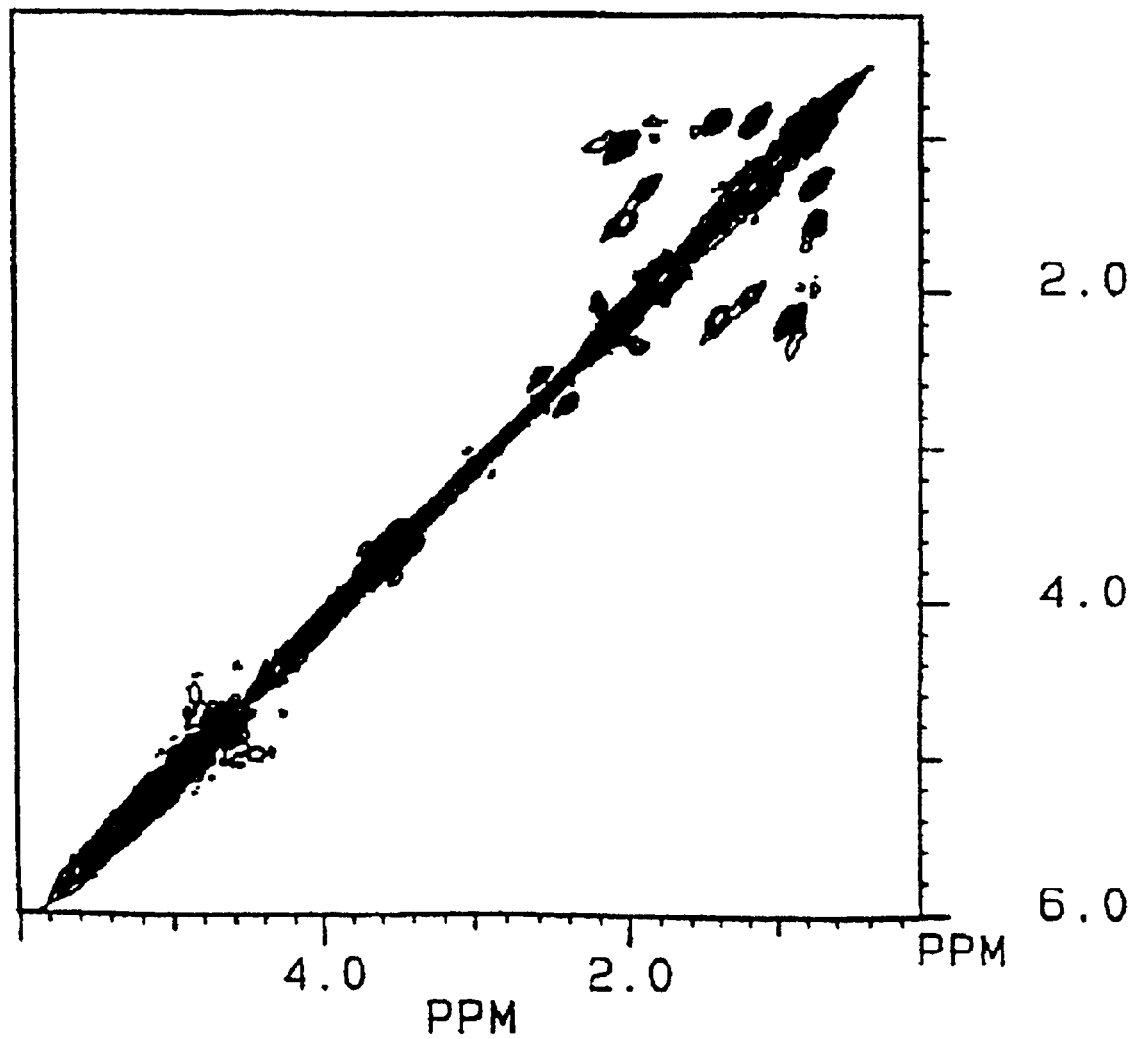
FIG. 1 is a 360 MHz$^1$H MR symmetrized COSY spectrum of human stool from a subject with a normal colon.

Sixty-nine human subjects (36 female, 33 male; average age 61 years, range 22–90 years), who were scheduled for colonoscopy or surgery were recruited to donate a single sample of stool. Tables 1 and 2 provide a breakdown of the cases.

TABLE 1

(Breakdown of subjects recruited)

| Cases | |
|---|---|
| Colorectal cancer | 24 |
| Normal | 13 |
| Adenomatous Polyps | 20 |
| Others | 12 |

TABLE 2

(Breakdown of subjects in "Others" category of Table 1)

| | |
|---|---|
| Hyperplastic Polyps | 3 |
| Colonic Tics | 2 |
| Diverticulosis and Liver Cancer | 1 |
| Lymphocytic Lymphoma | 1 |
| Melanosis Coli | 1 |
| Scattered Diverticula | 1 |
| Diverticulosis | 1 |
| Gastric Cancer | 1 |
| Enema Proctitis and Advanced Melanoma | 1 |

The subjects were instructed to collect the first bowel movement after the start of their colonic preparation for colonoscopy or surgery scheduled for the following day. The stool samples were collected at the University of Texas M.D. Anderson Cancer Center. The samples were kept frozen in the patients' refrigerators for an average of 24–48 hours prior to their delivery to the hospital in small ice chests (mailers). They were then stored in a –70° C. freezer until being shipped to the National Research Council Institute for Biodiagnostics, Winnipeg, Canada. All samples were shipped blindly in dry ice and kept frozen at –70° C. until the time of the experiment. There was no significant difference in the lengths of time for which the samples were kept frozen.

Sample Preparation

For MRS experiments, samples were thawed and an aliquot portion taken and suspended in PBS/$D_2O$ buffer. The suspension was then put inside a capillary tube (filled to approximately one-third of its volume) with one end closed with a Teflon (trademark for polytetrafluoroethylene) plug. This was then put in a standard 5 mm MR tube containing pamino benzoic acid (PABA) that served as a chemical shift reference.

MRS Experiments

All experiments were performed using an AMR-360 spectrometer (vintage 1986, Bruker Instruments) at 25° C. with the sample spinning at 20 Hz. Both single pulse 1D (90° pulse; Number of scans, NS=256; Recycle delay, RD=2.41 s; Number of data points in time domain, TD=4K; Spectral width, SW=5000 Hz), and 2D COSY (NS=128; Number of experiments, NE=180; TD2=2K; Spectral width in the second dimension, SW2=2906 Hz) MRS experiments were performed on each stool sample. Data sampling in the 2D COSY experiment was carried out with an initial delay of 1.2 ms between the two 90° pulses, an increment of 374 microseconds and a relaxation delay of 1 s. During this relaxation delay, low-power CW irradiation (20 dB below 0.2 W) was used to presaturate the water signal.

Data Processing

COSY data matrices underwent zero-filling to 1 K in $t_1$ domain, Fourier transformation, and magnitude calculation

[square root (Real$^2$+Imaginary)$^2$] to give 1024×1024 real data points for each 2D spectrum. Sine-bell window functions were uniformly applied in both the $t_1$ and $t_2$ domains prior to Fourier transformation. Contour plots were generated with the lowest level set close to the noise level and with subsequent levels increasing in powers of two.

Clinical Diagnosis

Colonoscopy was the standard to which the results were compared. Information such as the exact location of the neoplasia (tumor or polyp), the stage of the cancer, the histological type of polyps (i.e. tubular, villus, or tubulovillous), and the size and number of polyps was provided for each patient, where applicable.

Results

Figure 2:
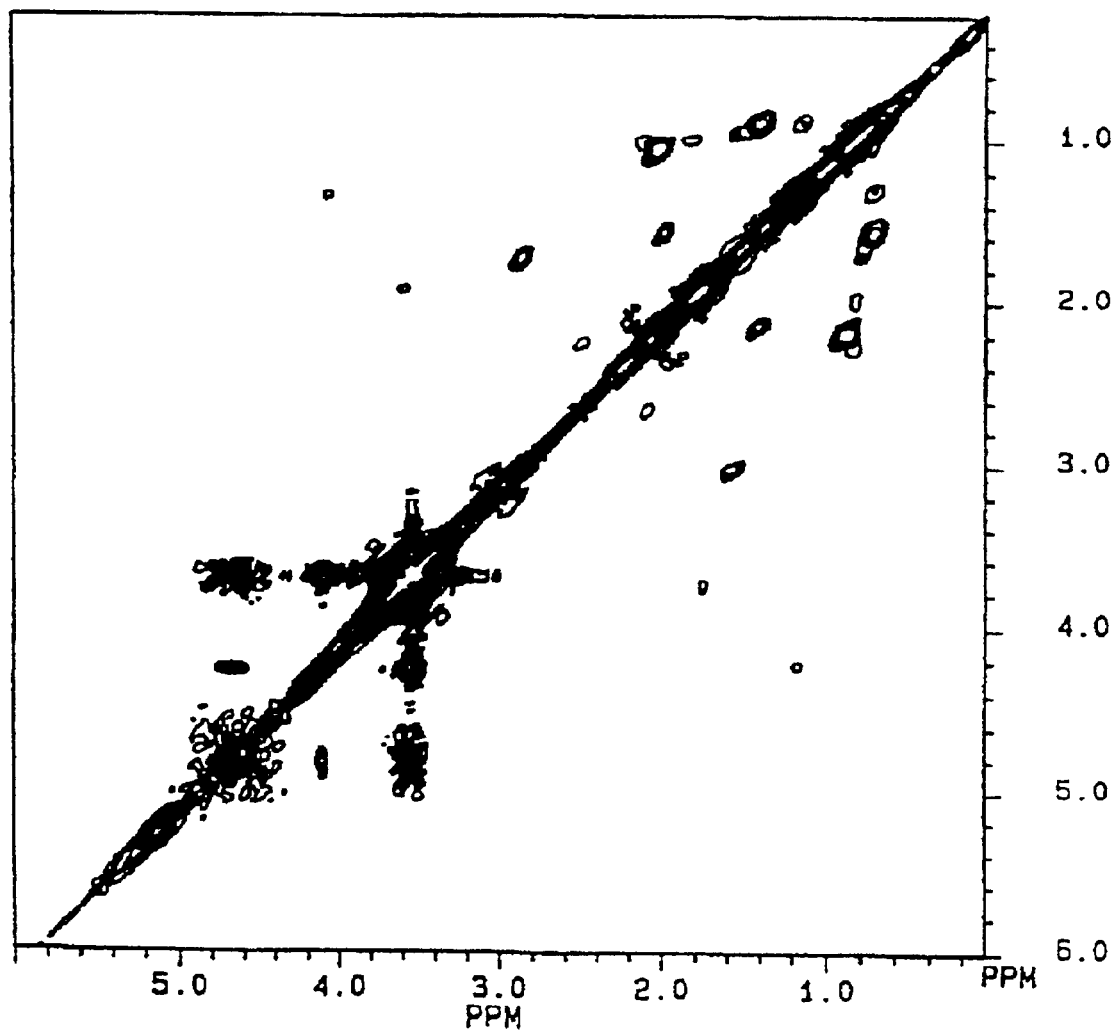
FIG. 2 is a 360 MHz$^1$H MR symmetrized COSY spectrum of human stool from a subject with adenomatous polyps (1 cm and 3 mm tubular adenomas in ascending colon)
Figure 3:
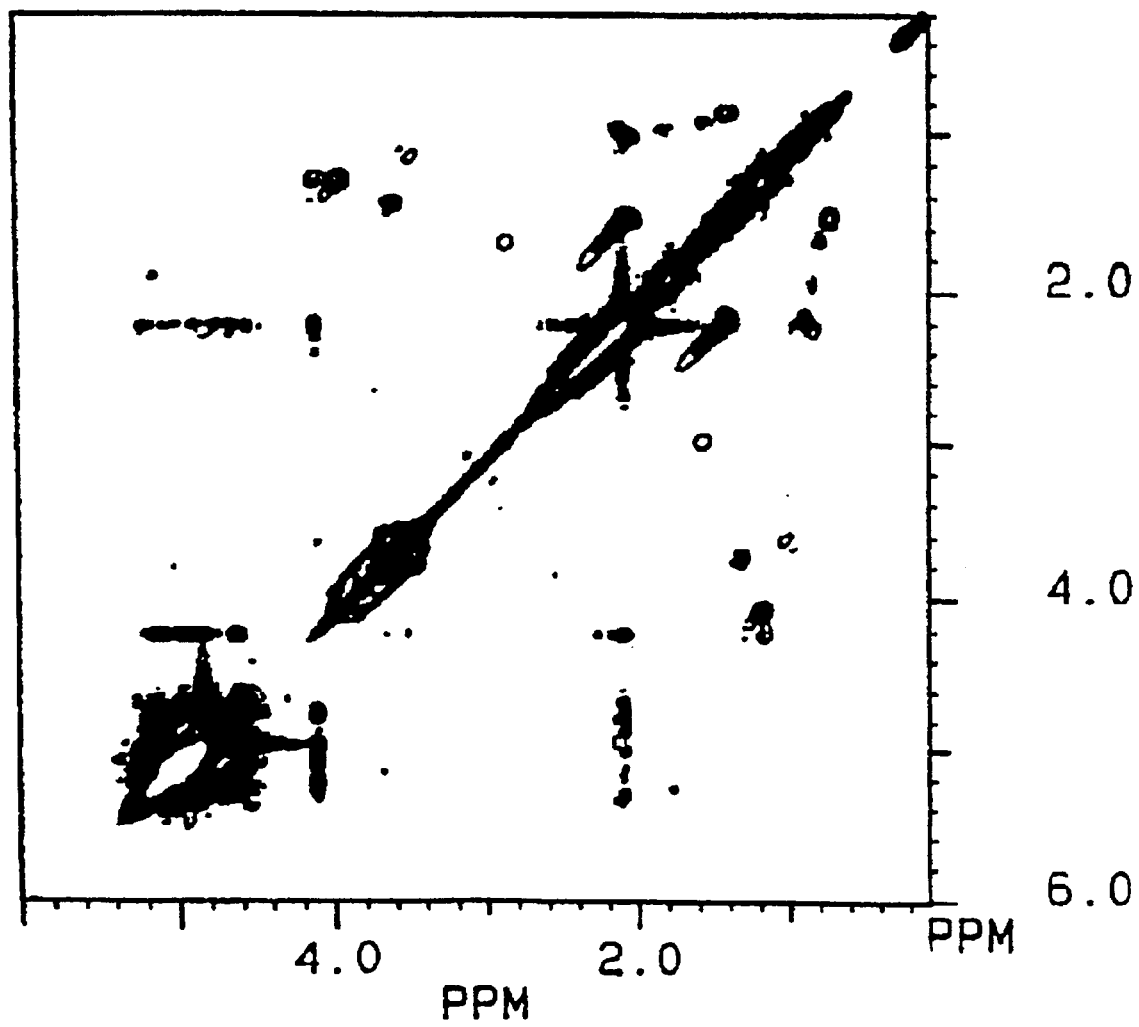
FIG. 3 is a 360 MHZ$^1$H MR symmetrized COSY spectrum of human stool from a subject with colorectal cancer (adenocarcinoma in the right colon, stage TisNOMX, with residual villus adenoma).

There were differences among the 1D MR spectra of the stool specimens obtained from normal subjects, those obtained from subjects with adenomatous polyps, and those from cancer patients. As can be seen in FIGS. 1 to 3, the most striking results, however, came from the 2D COSY MR spectra. When comparing the three COSY spectra in FIGS. 1 to 3, it can been seen that the COSY spectra of the stool specimen from a cancer patient (FIG. 3) has the highest overall number of cross peaks, with that of the normal one (FIG. 1) having the lowest number, and that of the polyp (FIG. 2) having an intermediate number.

The most interesting cross peak, however, is the one at 1.3–4.3 ppm which is present only in FIGS. 2 and 3. This cross peak is attributed to the methyl-methine ($H_5$–$H_6$) couplings of bound fucose and is believed to serve as a marker for the presence of colorectal neoplasia. An increase in the degree of fucosylation can also been seen as evidenced by the increase in the number and complexity of the fucose cross peaks, in FIG. 3 (cancer) compared to that in FIG. 2 (polyp).

Based on the presence or absence of the fucose cross peak, specimens were identified as being either positive or negative for neoplasia. The MRS results were then compared to the colonoscopic findings. The sensitivity, specificity and positive predictive value (PPV) for the MRS analysis are all indicated in Table 3. It is worth noting that 14 of the 20 subjects with adenomatous polyps gave positive results in the MRS analysis. Interestingly, 4 out of the 6 cases, which gave negative results, had polyps less than 1 cm in size.

TABLE 3

(Results (%) of MRS Diagnosis)

| | Sens. | Spec. | PPV |
|---|---|---|---|
| Cancer versus Normal | 83 | 85 | 91 |
| Polyps versus Normal | 70 | 85 | 88 |
| (Cancer + Polyps) versus Normal | 77 | 85 | 94 |
| (Cancer + Polyps) versus (Normal + Others) | 77 | 60 | 77 |

Sens = sensitivity, Spec = specificity and PPV = positive predictive value.

Conclusion

The results are consistent with earlier findings on colorectal cell lines and tissue biopsies where the presence of elevated levels of fucose on the cell surface was suggested to be a tumor marker (see Lean et al 1991, 1992 above). Besides indicating the presence and absence of cancer, the levels of fucose and the increase in complexity of the fucosylation patterns correlate with the grade and/or the stage of the cancer. Because of the already existing knowledge of the potential role of fucose/fucosylation in colorectal cancer, the fucose cross peak was exclusively relied upon to make the diagnosis. However, there were also other notable differences in the COSY spectra among the three groups that could provide additional diagnostic information, and thus are worth looking at.

The reported sensitivity of FOBT for a single test for colorectal carcinoma ranges between 30% to 50%, while its specificity is estimated to be about 90%. These values are lower for adenomatous polyps. As can be seen in Table 3, the sensitivity and positive predictive value of the method of the present invention is excellent, at least in this small sample. The diagnostic accuracy improves when all the subjects with some sort of abnormality from the analysis are excluded (compare row 3 vs. row 4 in Table 3). Although the sensitivity stays the same, both the specificity and the positive predictive value decrease considerably with the inclusion of such subjects. The last row, however, is the one that reflects the true clinical picture. In the case of subjects with other forms of cancer, there could have been some early microscopic metastasis to the colon missed on the colonoscopy. There was actually a case of a patient (not included in the analysis) with a history of colon cancer (resected) with metastasis to the lungs that had normal colonoscopy, but showed a positive result on the MRS analysis. Although colonoscopy is used as the gold standard in the analysis, as is the case in all other studies, reports show that 10–20% of polyps and up to 5% of colorectal cancers could be missed on conventional colonoscopy. All false-negative colonoscopies are assumed to be false-positive results for MRS. Thus, the true specificity and positive predictive value of the analysis could actually be higher than set out herein.

If the MRS method is to be of any use in the screening of asymptomatic subjects, it has to be able to identify those subjects with adenomatous polyps. A large percentage (70%) of these subjects gave positive MRS results. There is good evidence that the malignant potential of polyps depends on their size, histological type, and number of polyps. It is known that polyps less than 1 cm in size are less likely to become malignant, and ⅔ of those subjects who gave negative MRS results had polyps 1 cm or less in size. However, neither the histological type nor the number of polyps showed any correlation with the (accuracy of) MRS diagnosis.

In summary, the use of the method of the present invention makes it possible to make better decisions as to whether to perform full colonoscopy on a patient.

What is claimed is:

1. A method of detecting the presence of colorectal adenomas and colorectal cancer in a patient including the steps of subjecting a liquid suspension of a stool sample from the patient to magnetic resonance spectroscopy; and comparing the resulting spectrum with the magnetic resonance spectra of stool from non-cancerous subjects, observed differences in spectra being indicative of cancer.

2. A method according to claim 1, wherein the stool sample is subjected to two-dimensional correlation nuclear magnetic resonance spectroscopy.

3. A method according to claim 2, wherein the stool sample is subjected to $^1$H magnetic resonance symmetrized correlation spectroscopy.

4. A method according to claim 2, wherein the stool sample is subjected to 360$^1$ MHz magnetic resonance spectroscopy.

5. A method of detecting the presence of colorectal adenomas and colorectal cancer in a patient including the steps of collecting a sample of the patient's stool; forming a liquid suspension of the stool sample; subjecting the sample to magnetic resonance spectroscopy; and comparing the resulting spectrum with magnetic resonance spectra of stool from non-cancerous subjects, observed differences in spectra being indicative of cancer.

6. A method according to claim 5, wherein the stool sample is subjected to two-dimensional correlation nuclear magnetic resonance spectroscopy.

7. A method according to claim 5, wherein the stool sample is subjected to $^1$H magnetic resonance symmetrized correlation spectroscopy.

8. A method according to claim 5, wherein the stool sample is subjected to $360^1$ MHz magnetic resonance symmetrized correlation spectroscopy.

9. A method of detecting the presence of colorectal adenomas and colorectal cancer in a patient including the steps of subjecting a stool sample from the patient to magnetic resonance spectroscopy; and comparing the resulting spectrum with the magnetic resonance spectra of stool from non-cancerous subjects, observed differences in spectra being indicative of cancer.

10. A method according to claim 9, wherein the stool sample is subjected to two-dimensional correlation nuclear magnetic resonance spectroscopy.

11. A method according to claim 10, wherein the stool sample is subjected to $^1$H magnetic resonance symmetrized correlation spectroscopy.

12. A method according to claim 10, wherein the stool sample is subjected to $360^1$ MHz magnetic resonance spectroscopy.

13. A method of detecting the presence of colorectal adenomas and colorectal cancer in a patient including the steps of collecting a sample of the patient's stool; subjecting the sample to magnetic resonance spectroscopy; and comparing the resulting spectrum with magnetic resonance spectra of stool from non-cancerous subjects, observed differences in spectra being indicative of cancer.

14. A method according to claim 13, wherein the stool sample is subjected to two-dimensional correlation nuclear magnetic resonance spectroscopy.

15. A method according to claim 13, wherein the stool sample is subjected to $^1$H magnetic resonance symmetrized correlation spectroscopy.

16. A method according to claim 13, wherein the stool sample is subjected to $360^1$ MHz magnetic resonance symmetrized correlation spectroscopy.

* * * * *